(12) United States Patent
Gratz et al.

(10) Patent No.: US 8,017,902 B2
(45) Date of Patent: Sep. 13, 2011

(54) DETECTOR

(75) Inventors: Achim Gratz, Dresden (DE); Norbert Thyssen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 370 days.

(21) Appl. No.: 12/334,213

(22) Filed: Dec. 12, 2008

(65) Prior Publication Data

US 2010/0148039 A1 Jun. 17, 2010

(51) Int. Cl.
*H01L 27/00* (2006.01)

(52) U.S. Cl. ............... 250/214.1; 250/208.1; 257/448; 257/E27.137; 438/67

(58) Field of Classification Search ............... 250/208.1, 250/214.1, 214 R; 257/292, 293, 438, 448, 257/778, E27.137; 438/57, 67, 107
See application file for complete search history.

(56) References Cited

U.S. PATENT DOCUMENTS

2005/0045944 A1* 3/2005 Gratz et al. .................. 257/330
2010/0315179 A1* 12/2010 Schoepf et al. ............... 333/186

OTHER PUBLICATIONS

Jackson, J.C., et al., "Process Monitoring and Defect Characterization of Single Photon Avalanche Diodes," Proceedings of the 2001 International Conference on Microelectronic Test Structures, Mar. 19-22, 2001, 6 pages, IEEE.
Jackson, J.C., et al., "Characterization of Geiger Mode Avalanche Photodiodes for Fluorescence Decay Measurements," Proceedings of SPIE, vol. 4650-07, Jan. 19-25, 2002, 12 pages, IEEE.
Zappa, F., et al., "SPADA: Single-Photon Avalanche Diode Arrays," IEEE Photonics Technology Letters, vol. 17, No. 3, Mar. 2005, pp. 657-659, IEEE.
Niclass, C., et al., "A Single Photon Avalanche Diode Array Fabricated in Deep-Submicron CMOS Technology," 2006 Proceedings of Design, Automation and Test in Europe, vol. 1, Mar. 6-10, 2006, 6 pages, IEEE.
Otte, N., "The Silicon Photomultiplier—A new device for High Energy Physics, Astroparticle Physics, Industrial and Medical Applications," Proceedings of the International Symposium on Detector Development for Particle, Astroparticle and Synchrotron Radiation Experiments (SNIC 2006), Apr. 3-6, 2006, pp. 1-9, Stanford, CA.
Sciacca, E., et al., "Crosstalk Characterization in Geiger-Mode Avalanche Photodiode Arrays," IEEE Electron Device Letters, vol. 29, No. 3, Mar. 2008, pp. 218-220, IEEE.

* cited by examiner

*Primary Examiner* — Kevin Pyo
(74) *Attorney, Agent, or Firm* — Slater & Matsil, L.L.P.

(57) ABSTRACT

A detector includes a first semiconductor substrate and a second substrate, wherein the first semiconductor substrate includes a detector element for detecting a radiation or a particle and the second substrate includes a control circuit. The detector element extends from a first main surface of the first semiconductor substrate to a second main surface of the first semiconductor substrate.

19 Claims, 5 Drawing Sheets

DETECTOR

BACKGROUND

Embodiments of the invention relate to a detector and a method for detecting radiation or particles.

Radiation or particle detectors with a spatial or temporal resolution often require large arrays of sensors. One important factor for spatial resolution is the number of sensors per area.

BRIEF DESCRIPTION OF THE DRAWINGS

Embodiments according to the invention will be explained in greater detail in the following with reference to the accompanying Figures, in which.

DETAILED DESCRIPTION OF ILLUSTRATIVE EMBODIMENTS

Figure 1:
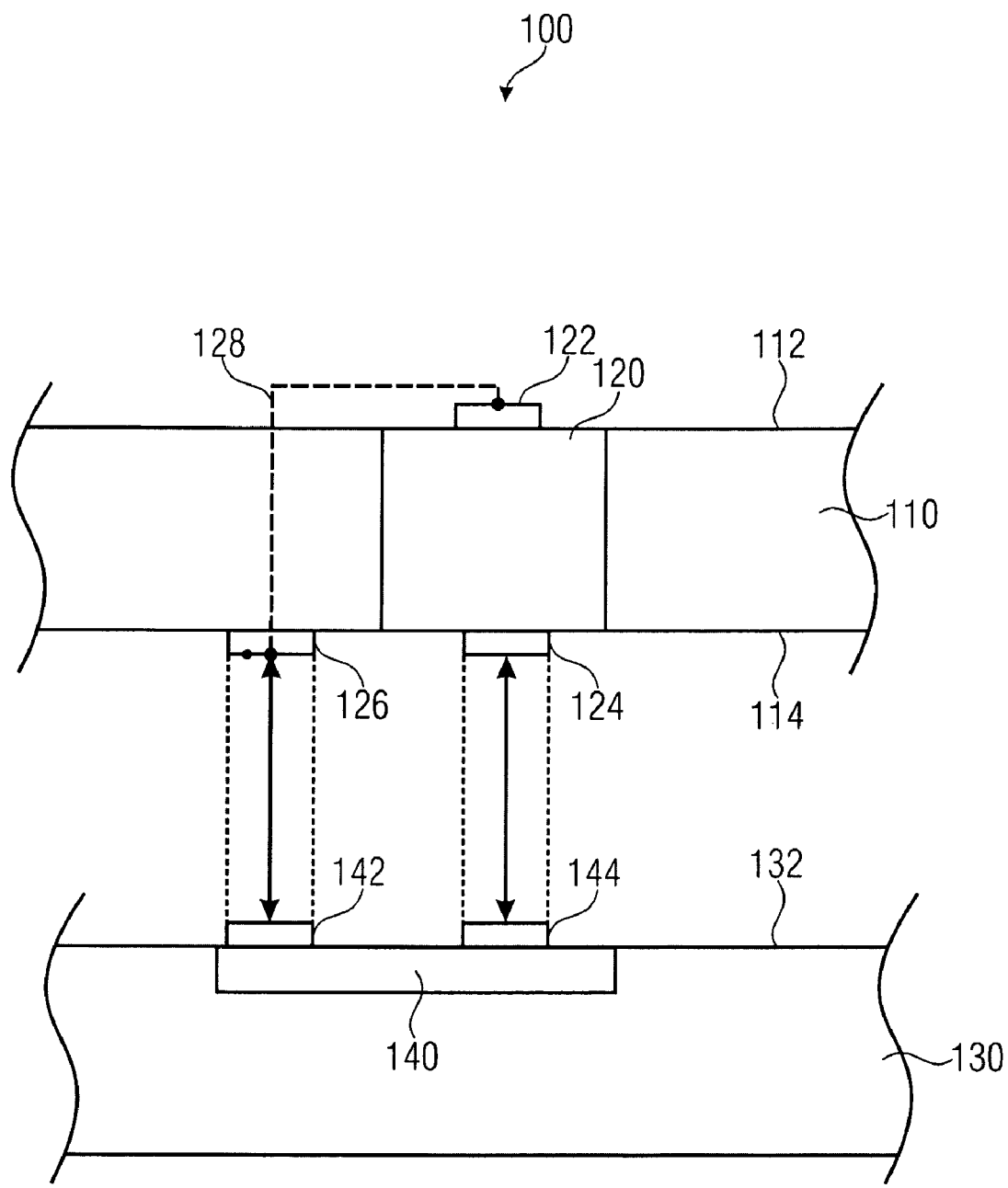
FIG. 1 is a schematic illustration of a detector.

FIG. 1 shows a schematic illustration of a detector 100 corresponding to an embodiment according to the invention. The detector 100 comprises a first semiconductor substrate 110 and a second substrate 130, wherein the first semiconductor substrate 110 comprises a detector element 120 for detecting a radiation or a particle and the second substrate 130 comprises a control circuit 140.

The detector element 120 extends from a first mains surface 112 of the first semiconductor substrate 110 to a second main surface 114 of the first semiconductor substrate 110 and comprises a first electrode 122 at the first main surface 112 and a second electrode 124 at the second main surface 114. The first main surface 112 and the second main surface 114 are opposite sides of the first semiconductor substrate 110. The first electrode 122 of the detector element 120 is connected (shown by reference numeral 128) to a first contact 126 of the detector element 120 at the second main surface 114 and the second electrode 124 of the detector element 120 forms a second contact of the detector element 120 at the second main surface 114.

The control circuit 140 is connected to a first contact 142 at the first main surface 132 of the second substrate 130 and a second contact 144 at the first main surface 132 of the second substrate 130, wherein the arrangement of the first contact 142 and the second contact 144 of the control circuit 140 on the first main surface 132 of the second substrate 130 corresponds to a mirrored arrangement of the first contact 126 and the second contact 124 of the detector element 120 on the second main surface 114 of the first semiconductor substrate 110, for providing a direct connection of the first semiconductor substrate 110 and the second substrate 130. The first contact 126 of the detector element 120 is connected to the first contact 142 of the control circuit 140 and the second contact 124 of the detector element 120 is connected to the second contact 144 of the control circuit 140.

Due to the described arrangement of the detector element 120 at the first semiconductor substrate 110 and the control circuit 140 at the second substrate 130 the area per detector element 120 may be reduced significantly, wherein the area of the detector element in this case is defined as the area which is occupied by the detector element 120 and the corresponding control circuit. Therefore, the so-called occupancy level of the sensor (detector), which is the area actually used for detection as a proportion of the total area, may be increased. This is not possible, when the detector element 120, which is also called sensor pixel, and the associated circuitry or control circuit 140 are integrated in a planar way. Also, the complexity of the control circuit, for example, an actuation and analyze circuitry, is not limited by given sensitivity, for example, the number of detector elements per area, as it is limited for a planar integration. In other words, the size (and therefore the complexity) of the control circuit, for example, does not depend on the size of that part of the area which is not used by the detector elements, because the control circuit and the detector elements are arranged on different substrates.

In addition, direct integration requires certain characteristics of the sensor element (detector element) and the components of the circuitry (control circuit) to be traded off against one another, and they cannot, or only with difficulty, be optimized independently of one another. By separating the detector element and the control circuit onto two different substrates the process technology for manufacturing the first semiconductor substrate comprising the detector element and the second substrate comprising the control circuit may be optimized independently for the respective needs. Also, a disruption of the analysis and actuation circuitry (control circuit), which may be caused by a radiation or a particle striking the sensor (detector), may be prevented by separating the detector element and the control circuit. Therefore, a further optical screening of the control circuit is not necessary and the cost of the detector, for example, a sensor array or a detector element array, may be reduced.

Due to the separation of the actual sensor (detector element) and the control circuit (for example, actuation and analysis circuitry) and a concomitant separate production of the appropriate wafers, for example, the characteristics of the components and their manufacturing costs can be optimized separately from each other. This may offset or even overcompensate the additional costs of the vertical integration.

Thus, the detector comprises a vertical integration of the detector element, for example, an array of detector elements or a sensor array, and the control circuit, for example, actuation and analysis electronics, whereby the detector element connections (or, for example, from the whole sensor array) are arranged on the rear side (the second main surface of the first semiconductor substrate) and are connected to the appropriate connections for the control circuit (for example, actuation and analysis electronics).

Thus, the detector element or, for example, a whole array of detector elements or a sensor array is separated from the control circuit (for example, analysis electronics) and may be integrated with them, for example, by vertical stacking at the chip or wafer level.

The detector may comprise a plurality of detector elements which are, for example, arranged as an array. The detector is also called a sensor and an array of detector elements is also called a sensor array. By using more than one detector element it may be necessary to arrange an optical screening for the detector elements. The optical screening of the detector elements (sensors) from another may be realized or effected by trenches (between the detector elements) which are, for example, filled with a material which is not transparent to light.

The connection between the first electrode of the detector element at the first main surface of the first semiconductor substrate and the first contact of the detector element at the second main surface may be realized in different ways.

In some embodiments of the invention, trenches, which may be existent for the optical screening anyway, are used to lead an electrode (the first electrode at the first main surface) of the detector element (which is, for example, a diode) to the rear side (second main surface of the first semiconductor substrate) while the contact may be made to the second electrode directly from the rear side (second main surface). For example, the first electrodes of the detector elements of a detector element array may be realized as a shared electrode, while the second electrode may be realized individually for each detector element, which is also called a pixel. Therefore, the achievable occupancy level may be determined by a necessary optical screening. The control circuit (for example, actuation analysis circuitry) can take up the entire area of an individual pixel (or more, if a redistribution for the contacts of the control circuits is done) and, hence, for example, more complex actuation analysis functions (more complex control circuit) can be realized without detriment to the occupancy level.

The vertical integration or in other words the connection of the first semiconductor substrate and the second substrate may be realized by direct joining of the two wafers (or chips) by means of studs or bumps and (solid phase) soldering processes, wherein the sensor wafer (the first semiconductor substrate), for example, is thinned down to a thickness of less than 100 μm prior to assembly. The thickness may be chosen according to the used detector element type (for example, photo diode, avalanche photodiode) or the manufacturing possibilities, and may vary from about 600 μm down to about 10 μm or also if possible less. For example, the thickness may be less than about 600 μm, 300 μm, 100 μm, 50 μm, 20 μm, 10 μm or 1 μm or may vary between about 1 μm and 600 μm, 1 μm and 300 μm, 1 μm and 100 μm, 1 μm and 10 μm, 10 μm and 100 μm or 50 μm and 200 μm. Due to a direct joint between corresponding connections, a very short conductor length may be achieved.

Alternatively, interconnections can be effected via an intermediate layer. The back-feed of the electrodes which lie on the surface of the sensor array (the first main surface of the first semiconductor substrate) may be effected by the trenches which are in many cases present for the purpose of optical screening which are, for example, filled with a highly-doped poly-silicon or with a metal to reduce the resistance. The trench filling can alternatively be removed before assembly, and be replaced by a material with a higher conductivity.

Alternatively, only after the wafer has been thinned the trenches may be, either in part or entirely, introduced and filled with a highly conductive material, such as, for example, copper, from the rear side of the wafer.

In some embodiments of the invention, the detector comprises a high voltage part. If a high voltage part (HV part) is needed, for example, for controlling the detector element, the high voltage part may be integrated by planar integration with the sensor array (at the first semiconductor substrate) whereas the low voltage part (LV part) which is, for example, the actuation and analysis circuitry, may be integrated at the second substrate, which is also called a base wafer. This reduces the occupancy level somewhat but avoids the cost of integrating the high voltage part (HV) onto the base wafer, from which, for example, further cost optimization can result.

Figure 2:
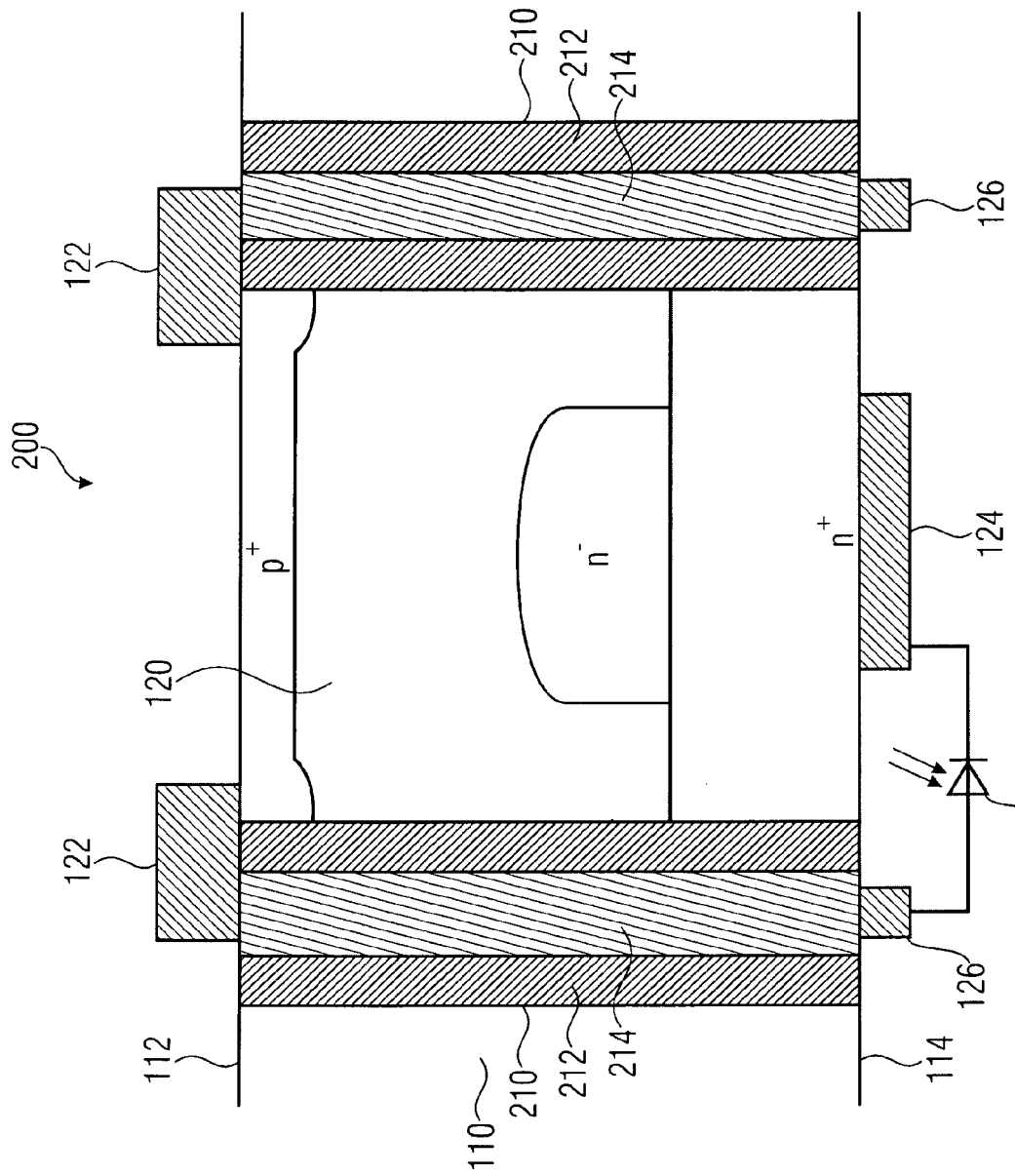
FIG. 2 is a schematic illustration of a detector element.

FIG. 2 shows a schematic illustration 200 of the detector element 120 corresponding to an embodiment of the invention. The detector element 120 in this case is designed as an avalanche photo diode with a highly P-doped region (P+) at the first main surface 112, a highly N-doped region (N+, for example, n+ epitaxy layer) at the second main surface 114 and a lowly N-doped region (N−), which is also called the avalanche region, in between.

At the left and the right side of the detector element 120, a trench 210 is shown, which connects the first electrode 122 of the detector element 120 at the first main surface 112 with the first contact 126 of the detector element 120 at the second main surface 114. The trenches 210 comprise a conductive trench filling 214, which is isolated by a trench isolation 212, also called a trench liner, from the surrounding semiconductor substrate material.

As mentioned before, the first semiconductor substrate (wafer) may be thinned from the backside (second main surface) after processing and the first electrode 126 and the second electrode 124 may be realized as bump or stud metal. By using a plurality of detector elements, the first electrode, for example, the anode, may be a common terminal in the array. The detector element in form of the avalanche photo diode is integrated on the first semiconductor substrate 110 (for example, top wafer) and a control circuit on the second substrate, for example, CMOS bottom wafer.

The symbol 220 indicates the electrical function of the detector element.

The trenches comprise, for example, an aspect radio between about 3 to 1 and about 100 to 1. The thickness of the trench isolation may reach from the thickness of a gate oxide to several μm depending on the voltages applied. For example, the trench may comprise a width of about 2 μm and a trench isolation with a thickness of about 0.5 μm. The conductive trench fill may fill the whole trench or is only realized as a thin conductive layer on top of the trench isolation.

For example, scintillation detectors for PET scanners (positron emission tomography) and other radiation detectors with a spatial or temporal resolution require large arrays of single photon sensors. A single photon detector element may be realized as a photo multiplier tube or an avalanche photo diode (APD). Avalanche photo diodes may be operated for brief periods beyond the breakdown voltage in the so-called Geiger mode and, depending on the over voltage, amplification factors of well over 1000 can be realized by the avalanche effect and, hence, it is possible to detect single photons. Avalanche photo diodes are, however, very noisy due to thermal generation of charge carriers, apart from which the avalanche breakdown must be stopped by decreasing the voltage across the diode in order to prevent destruction of the component. For this purpose, for example, a so-called quench circuit is used. Apart from this, it is frequently necessary to disable defect diodes and to realize an extremely precise spatially and temporally resolved analysis of the detection events. Therefore, a complex circuit which, for example, must be replicated for each pixel of the sensor (each detector element of the detector), may be necessary.

During an avalanche breakdown, photons are also generated and so it is necessary to control the cross-talk (between the detector elements), for example, by appropriately large spacing or by light-tight screening of the sensors from one another. The optical screening can be realized, as mentioned before, by trenches between the detector elements. By using trenches for the connections of the first electrodes and the first contacts of the detector elements irradiation by light which is generated by an avalanche breakdown itself can be prevented by suitable structuring of the connections (trenches) and the materials used for the vertical integration.

Figure 3:
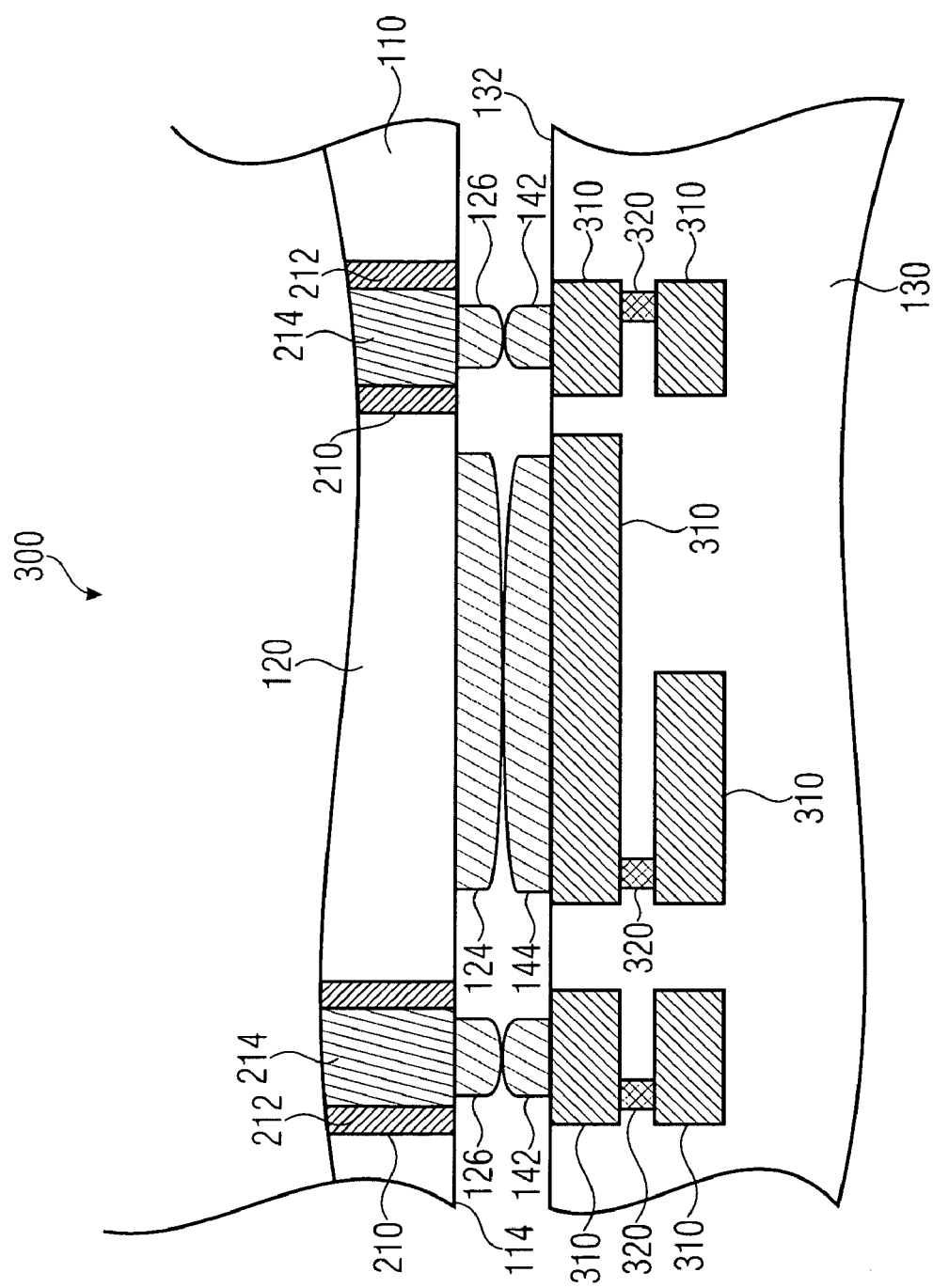
FIG. 3 is a schematic illustration of a direct connection of a first semiconductor substrate and a second substrate.

FIG. 3 shows a schematic illustration of the direct connection 300 of the first semiconductor substrate 110 and the second substrate 130 corresponding to an embodiment of the invention. FIG. 3 shows a first contact 126 and a second contact 124 of the detector element 120 at the second main surface 114 of the first semiconductor substrate 110 and the mirrored arrangement of the first contact 142 and the second contact 144 of the control circuit at the first main surface 132 of the second substrate 130.

As mentioned before, the contacts may be realized, for example, as bumps or studs and may be connected by a soldering process. The remaining cavities between the first semiconductor substrate 110 and the second substrate 130 may be filled with filling material.

In this example, the second substrate 130 comprises a plurality of metal layers 310, wherein two layers are shown and a plurality of conductive connections 320 (vias) between the metal layers 310. Additionally, the second substrate 130 comprises a second semiconductor substrate where the active elements (for example, transistors) of the control circuit are arranged. The first contact 142 and the second contact 144 of the control circuit are connected by the metal layers 310 and the connections between the metal layers 320 to the active elements of the control circuit.

The first contact 142 and the second contact 144 of the control circuit may be directly processed on top of the last metal layer (the metal layer nearest to the first main surface of the second substrate) which is connected to the metal layers below by the last via layer. The first semiconductor substrate is also called a top wafer which, for example, comprises an avalanche photo diode array and the second substrate is also called a bottom wafer which, for example, comprises the control circuit (for example, control and sense circuit) in CMOS-technology.

Figure 4:
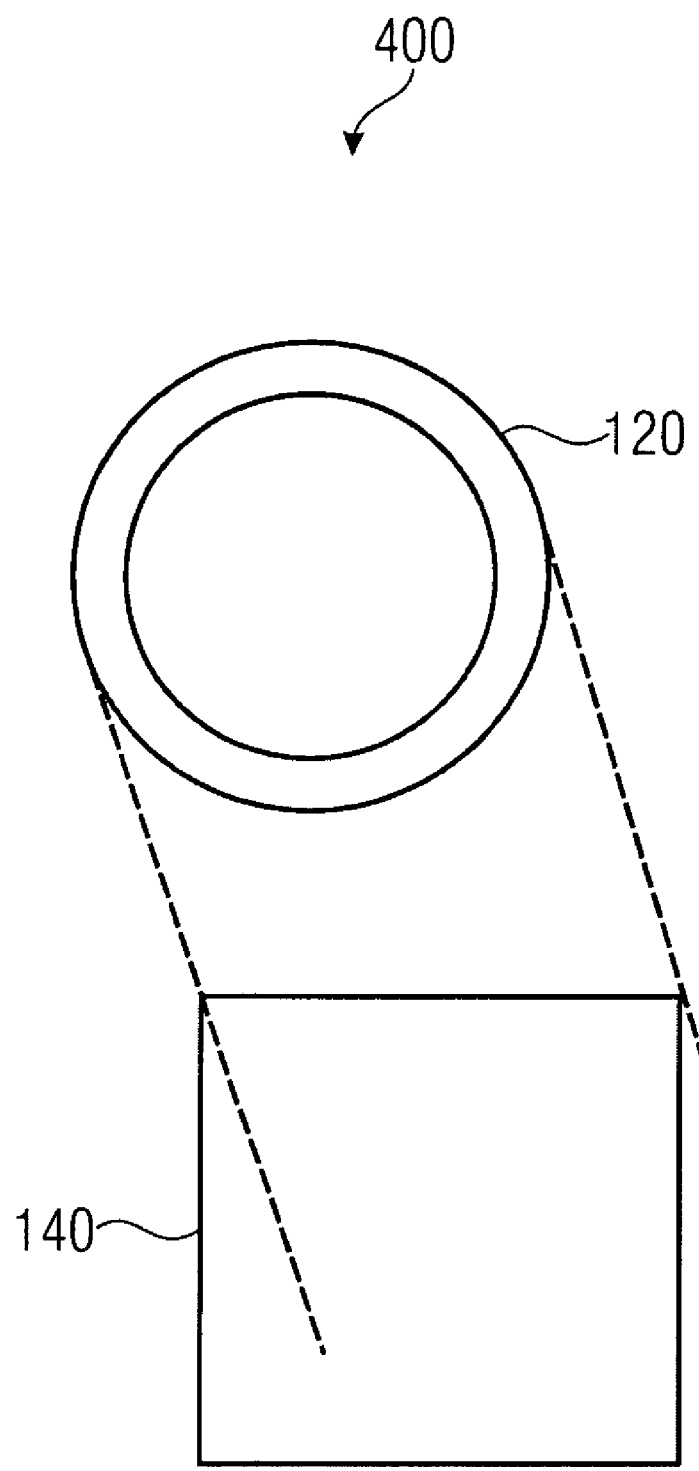
FIG. 4 is a schematic illustration of a detector element and a control circuit.

FIG. 4 shows a schematic illustration 400 of a detector element 120 and a control circuit 140 corresponding to an embodiment of the invention. FIG. 4 shows a circular detector element 120 which is approximately of the same size like the square control circuit 140. In this example, the detector element 120 comprises a circular shape, but also a square shape or a rectangular shape is possible. Using a circular shape may support the development of a homogeneous electric field.

By using a control circuit 140 of approximately the same size as the detector element 120, leads to a good utilization of the area of the first semiconductor substrate and of the area of the second substrate. The size of the control circuit 140 depends on its complexity. If the size of the control circuit 140 is larger than the detector element 120, it is possible to keep the occupancy level of the detector elements by redistributing the contacts of the control circuit by metal layers so that the contacts of the control circuit will nevertheless keep the mirrored arrangement of the contacts of the detector element.

Figure 5:
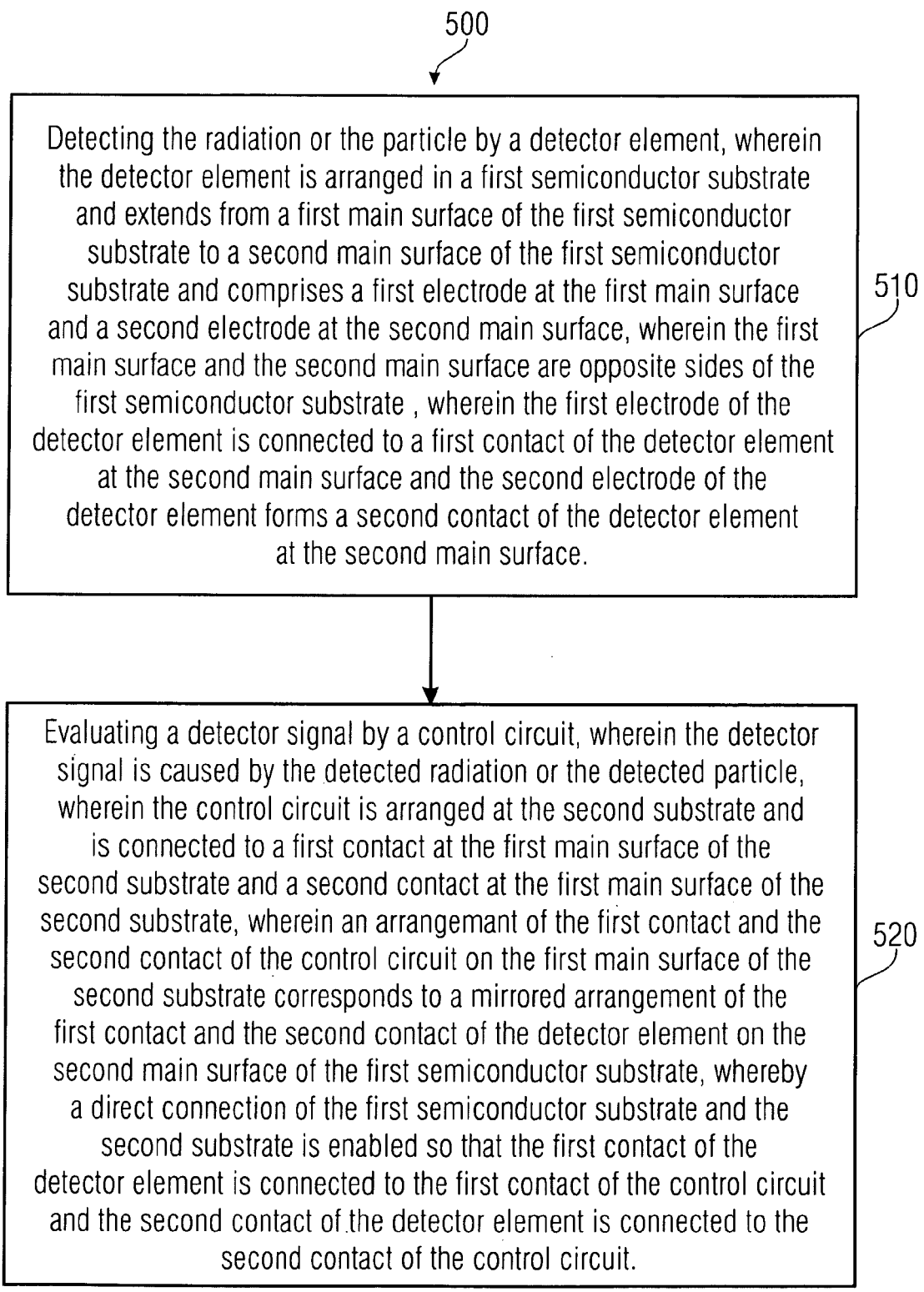
FIG. 5 is a flow chart of a method for detecting a radiation or a particle.

FIG. 5 shows a flow chart of a method 500 for detecting a radiation or a particle corresponding to an embodiment of the invention. The method 500 comprises a detection, in step 510, of the radiation or the particle by a detector element and an evaluation, in step 520, of a detector signal by a control circuit.

The detector element is arranged in a first semiconductor substrate and extends from a first main surface of the first semiconductor substrate to a second main surface of the first semiconductor substrate. The detector element comprises a first electrode at the first main surface and a second electrode at the second main surface, wherein the first main surface and the second main surface are opposite sides of the first semiconductor substrate. The first electrode of the detector element is connected to a first contact of the detector element at the second main surface and the second electrode of the detector element forms a second contact of the detector element at the second main surface.

The detector signal is caused by the detected radiation or a detected particle.

The control circuit is arranged at the second substrate and is connected to a first contact at a first main surface of the second substrate and a second contact at the first main surface of the second substrate. An arrangement of the first contact and the second contact of the control circuit on the first main surface of the second substrate corresponds to a mirrored arrangement of the first contact and the second contact of the detector element on the second main surface of the first semiconductor substrate. In this way, a direct connection of the first semiconductor substrate and the second substrate is enabled so that the first contact of the detector element is connected to a first contact of the control circuit and the second contact of the detector element is connected to the second contact of the control circuit.

Optional reset of the detector element after detecting a radiation or a particle may be done, wherein the reset of the detector element is controlled by the control circuit.

Some embodiments of the invention relate to a construction of a detector array from silicon-based integrated circuits. This may be of interest, because they can be manufactured at relatively low cost.

In some embodiments of the invention, the detector element is an avalanche photo diode. For an avalanche photo diode, it may be possible to detect, for example, single photon events. By using a separate control circuit for each detector element, the time resolution may be very high, because during a reset of a single detector element it is possible to detect another photon with the other detector elements. For example, the readout of a row or a column of detector elements is also possible, which would reduce the needed area for the control circuit, but by doing so the time resolution may go down.

Instead of an avalanche photo diode, a normal photo diode may also be used.

In some embodiments of the invention, the detector comprises a high spatial and temporal resolution because by separating the control circuit and the detector elements a high complexity of the control circuit for each detector element is attainable, despite a high occupancy level of the detector elements.

This is, for example, of high interest for a positron-emission-tomography-scanner or a high speed camera.

Some embodiments of the invention relate to a utilization of a detector within a positron-emission-tomography-scanner (PET-Scanner). To conduct the scan, a short-lived radioactive tracer isotope, is injected into the living subject (usually into blood circulation). The tracer is chemically incorporated into a biologically active molecule, and eventually decays, emitting a positron.

As the radioisotope undergoes positron emission decay (also known as positive beta decay), it emits a positron, the antimatter counterpart of an electron. After travelling up to a few millimeters the positron encounters and annihilates with an electron, producing a pair of annihilation (gamma) photons moving in opposite directions. These are detected when they reach the detector. The technique depends on simultaneous or coincident detection of the pair of photons; photons which do not arrive in pairs (i.e., within a timing window of a few nanoseconds) are ignored. Since the two photons must reach detector elements at opposite sides of the detector, wherein the detector is, for example, a ring detector, the thermal noise may be ignored.

The most significant fraction of electron-positron decays result in two 511 keV gamma photons being emitted at almost 180 degrees to each other; hence it is possible to localize their source along a straight line of coincidence (also called formally the line of response or LOR). In practice the LOR has a finite width as the emitted photons are not exactly 180 degrees apart. If the recovery time of detectors is in the picosecond range rather than the 10's of nanosecond range, it is possible to localize the event to a segment of a cord, whose length is determined by the detector timing resolution. As the timing resolution improves, the signal-to-noise ratio (SNR) of the image will improve, requiring less events to achieve the same image quality. Therefore the time resolution is very important.

Some embodiments of the invention relate to a detector with a plurality of detector elements. The detector elements may be arranged in an array with rows and columns, in an arrangement with another symmetry or without any symmetry.

Some further embodiments of the invention relate to detector elements with circular shape. The circular shape of the detector element may support a development of a homogeneous electric field. By using a plurality of detector elements with circular shape, the detector elements may be, for example, arranged with a hexagonal symmetry.

Some embodiments of the invention relate to an avalanche photo diode array with high fill-factor (occupancy level) and integrated control circuitry (integrated on a second substrate).

In the present application, the same reference numerals are partly used for objects and functional units having the same or similar functional properties.

Although some claims only relate to one other claim, also a combination with further claims may be possible.

In particular, it is pointed out that, depending on the conditions, the inventive scheme may also be implemented in software. The implementation may be on a digital storage medium, particularly a floppy disk or a CD with electronically readable control signals capable of cooperating with a programmable computer system so that the corresponding method is executed. In general, the invention thus also consists in a computer program product with a program code stored on a machine-readable carrier for performing the inventive method, when the computer program product is executed on a computer. Stated in other words, the invention may thus also be realized as a computer program with a program code for performing the method, when the computer program product is executed on a computer.

What is claimed is:

1. A detector comprising:
   a first semiconductor substrate comprising a detector element for detecting a radiation or a particle, wherein the detector element extends from a first main surface of the first semiconductor substrate to a second main surface of the first semiconductor substrate and comprises a first electrode at the first main surface and a second electrode at the second main surface, wherein the first main surface and the second main surface are opposite surfaces of the first semiconductor substrate, wherein the first electrode of the detector element is coupled to a first contact of the detector element at the second main surface and the second electrode of the detector element forms a second contact of the detector element at the second main surface; and
   a second substrate comprising a control circuit, wherein the control circuit is coupled to a first contact at a first main surface of the second substrate and a second contact at the first main surface of the second substrate, wherein an arrangement of the first contact and the second contact of the control circuit on the first main surface of the second substrate corresponds to a mirrored arrangement of the first contact and the second contact of the detector element on the second main surface of the first semiconductor substrate, for providing a direct connection of the first semiconductor substrate and the second substrate, wherein the first contact of the detector element is coupled to the first contact of the control circuit and the second contact of the detector element is coupled to the second contact of the control circuit.

2. The detector according to claim 1, wherein the first semiconductor substrate comprises a second detector element, wherein a first electrode of the second detector element at the first main surface of the first semiconductor substrate is connected to the first electrode of the detector element and the second electrode of the second detector element at the second main surface of the first semiconductor substrate forms a second contact of the second detector element at the second main surface of the first semiconductor substrate.

3. The detector according to claim 1, wherein the first semiconductor substrate comprises a plurality of detector elements arranged as an array.

4. The detector according to claim 1, wherein the control circuit comprises an evaluation unit and a control unit, wherein the evaluation unit is configured to evaluate a signal from the detector element and the control unit is configured to control the detector element.

5. The detector according to claim 1, wherein the first semiconductor substrate comprises a thickness of less than 300 μm between the first main surface and the second main surface.

6. The detector according to claim 1, wherein the first electrode of the detector element and the first contact of the detector element are coupled by a conductive filling of a trench, wherein the trench extends from the first main surface of the first semiconductor substrate to the second main surface of the first semiconductor substrate.

7. The detector according to claim 6, wherein the trench is filled with opaque material for reducing scattered light.

8. The detector according to claim 1, wherein the detector is configured so that a highest operating voltage used within any electrical circuit at the first semiconductor substrate is higher than a highest operating voltage used within any electrical circuit at the second substrate.

9. The detector according to claim 1, wherein the second substrate comprises a second semiconductor substrate and comprises one or more metal layers between a first main surface of the second semiconductor substrate and the first main surface of the second substrate, the one or more metal layers being partially separated from each other by isolating material.

10. The detector according to claim 1, wherein the detector element comprises an avalanche photodiode for detecting radiation.

11. A detector comprising:
   a first semiconductor substrate comprising an avalanche photodiode for detecting radiation, wherein the e avalanche photodiode extends from a first main surface of the first semiconductor substrate to a second main surface of the first semiconductor substrate and comprises a first electrode at the first main surface and a second electrode at the second main surface, wherein the first main surface and the second main surface are opposite sides of the first semiconductor substrate, wherein the first electrode of the avalanche photodiode is connected to a first contact of the avalanche photodiode at the second main surface and the second electrode of the avalanche photodiode forms a second contact of the avalanche photodiode at the second main surface, wherein the first electrode of the avalanche photodiode and the first contact of the avalanche photodiode are connected by a trench, wherein the trench extends from the first main surface of the first semiconductor substrate to the second main surface of the first semiconductor substrate; and a second substrate comprising a control circuit, wherein the control circuit is connected to a first contact at a first main surface of the second substrate and a second contact at the first main surface of the second substrate, wherein an arrangement of the first contact and the second contact of the control circuit on the first main surface of the second substrate corresponds to a mirrored arrangement of the first contact and the second contact of the avalanche photodiode on the second main surface of the first semiconductor substrate, for providing a direct connection of the first semiconductor substrate and the second substrate, wherein the first contact of the avalanche photodiode is connected to the first contact of the control circuit and the second contact of the avalanche photodiode is connected to the second contact of the control circuit, and wherein the control circuit comprises an evaluation unit and a control unit, wherein the evaluation unit is configured to evaluate a signal from the avalanche photodiode and the control unit is configured to control the avalanche photodiode.

12. The detector according to claim 11, wherein the first semiconductor substrate comprises a second avalanche photodiode, wherein a first electrode of the second avalanche photodiode at the first main surface of the first semiconductor substrate is connected to the first electrode of the avalanche photodiode and the second electrode of the second avalanche photodiode at the second main surface of the first semiconductor substrate forms a second contact of the second avalanche photodiode at the second main surface of the first semiconductor substrate.

13. The detector according to claim 11, wherein the first semiconductor substrate comprises a plurality of avalanche photodiodes arranged as a array.

14. The detector according to claim 11, wherein the first semiconductor substrate comprises a thickness of less than 300 μm between the first main surface and the second main surface.

15. The detector according to claim 11, wherein the trench is filled with conductive and opaque material and is arranged to reduce scattering light.

16. A method for detecting radiation or particles, comprising:
    detecting radiation or particles with a detector element, wherein the detector element is arranged in a first semiconductor substrate and extends from a first main surface of the first semiconductor substrate to a second main surface of the first semiconductor substrate and comprises a first electrode at the first main surface and a second electrode at the second main surface, wherein the first main surface and the second main surface are opposite sides of the first semiconductor substrate, wherein the first electrode of the detector element is connected to a first contact of the detector element at the second main surface and the second electrode of the detector element forms a second contact of the detector element at the second main surface; and evaluating a detector signal from the detector element with a control circuit, wherein the detector signal is caused by the detected radiation or the detected particle, wherein the control circuit is arranged at a second substrate and is connected to a first contact at a first main surface of the second substrate and a second contact at the first main surface of the second substrate, wherein an arrangement of the first contact and the second contact of the control circuit on the first main surface of the second substrate corresponds to a mirrored arrangement of the first contact and the second contact of the detector element on the second main surface of the first semiconductor substrate, whereby a direct connection of the first semiconductor substrate and the second substrate is enabled so that the first contact of the detector element is connected to the first contact of the control circuit and the second contact of the detector element is connected to the second contact of the control circuit.

17. The method for detecting radiation or particles according to claim 16, further comprising:
    resetting the detector element after detecting the radiation or particles, wherein the reset of the detector element is controlled by the control circuit.

18. The method for detecting radiation or particles according to claim 16, wherein the detector element is an avalanche photodiode for detecting radiation.

19. A computer program product comprising a non-transitory computer-readable storage medium storing program code for performing a method for detecting radiation or particles, the method comprising:
    detecting radiation or particles with a detector element, wherein the detector element is arranged in a first semiconductor substrate and extends from a first main surface of the first semiconductor substrate to a second main surface of the first semiconductor substrate and comprises a first electrode at the first main surface and a second electrode at the second main surface, wherein the first main surface and the second main surface are opposite sides of the first semiconductor substrate, wherein the first electrode of the detector element is connected to a first contact of the detector element at the second main surface and the second electrode of the detector element forms a second contact of the detector element at the second main surface; and
    evaluating a detector signal by a control circuit, wherein the detector signal is caused by the detected radiation or the detected particle, wherein the control circuit is arranged at a second substrate and is connected to a first contact at a first main surface of the second substrate and a second contact at the first main surface of the second substrate, wherein an arrangement of the first contact and the second contact of the control circuit on the first main surface of the second substrate corresponds to a mirrored arrangement of the first contact and the second contact of the detector element on the second main surface of the first semiconductor substrate, whereby a direct connection of the first semiconductor substrate and the second substrate is enabled so that the first contact of the detector element is connected to the first contact of the control circuit and the second contact of the detector element is connected to the second contact of the control circuit.

* * * * *

UNITED STATES PATENT AND TRADEMARK OFFICE
CERTIFICATE OF CORRECTION

| | | |
|---|---|---|
| PATENT NO. | : 8,017,902 B2 | |
| APPLICATION NO. | : 12/334213 | |
| DATED | : September 13, 2011 | |
| INVENTOR(S) | : Gratz et al. | |

It is certified that error appears in the above-identified patent and that said Letters Patent is hereby corrected as shown below:

In Col. 8, line 55, claim 11, after "wherein the" delete "e".

Signed and Sealed this
Seventh Day of February, 2012

David J. Kappos
*Director of the United States Patent and Trademark Office*